(12) United States Patent
Köpken

(10) Patent No.: US 7,411,530 B2
(45) Date of Patent: Aug. 12, 2008

(54) METHOD FOR THE EVALUATION OF A FIRST ANALOG SIGNAL AND A SECOND ANALOG SIGNAL, AND EVALUATION CIRCUIT CORRESPONDING THEREWITH

(75) Inventor: Hans-Georg Köpken, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/632,524

(22) PCT Filed: Jul. 7, 2005

(86) PCT No.: PCT/EP2005/053242

§ 371 (c)(1),
(2), (4) Date: Jan. 16, 2007

(87) PCT Pub. No.: WO2006/005714

PCT Pub. Date: Jan. 19, 2006

(65) Prior Publication Data

US 2007/0245196 A1    Oct. 18, 2007

(30) Foreign Application Priority Data

Jul. 14, 2004    (DE) .................. 10 2004 033 990

(51) Int. Cl.
*H03M 1/48* (2006.01)
(52) U.S. Cl. ....................... 341/115; 341/155
(58) Field of Classification Search ............ 341/15, 341/16, 17, 13, 5, 8, 115, 155, 118
See application file for complete search history.

(56) References Cited

U.S. PATENT DOCUMENTS 5,066,953 A * 11/1991 Lengenfelder et al. ...... 341/155

(Continued)

FOREIGN PATENT DOCUMENTS

DE    43 31 151 A1    3/1995

(Continued)

OTHER PUBLICATIONS

Altera Corporation, "Cordic Reference Design"; Oct. 2003, pp. 1-16; Version 1.3; Application Note 263; San Jose, CA, US.

(Continued)

*Primary Examiner*—Brian Young

(57) ABSTRACT

Two analog signals are substantially sinusoidal and out-of-phase by about 9020 relative to each other when an element moves in a temporally uniform manner in relation to a stationary element. The two analog signals make it possible to determine the actual position of the moving element relative to the stationary element. The analog signals have a corresponding maximum frequency when the moving element moves at a maximum speed. The signals are detected by sensor units and are fed to AD converters which digitize the signals at a scanning frequency and feed corresponding digital signals to an evaluation block that is configured as a hardware circuit, the scanning frequency of the AD converters being more than twice as large as the maximum frequency. The digital signals are fed to a computing block within the evaluation block, said computing block calculating an arc tangent that corresponds to the digital signals in real time. The evaluation block also determines corrective values for the digital signals in real time based on the digital signals.

18 Claims, 8 Drawing Sheets

U.S. PATENT DOCUMENTS

| | | | |
|---|---|---|---|
| 5,399,981 A * | 3/1995 | Vermesse | 324/714 |
| 5,612,906 A | 3/1997 | Gotz | |
| 5,999,113 A | 12/1999 | Kiriyama et al. | |
| 6,018,318 A | 1/2000 | Schödlbauer | |
| 6,418,388 B1 | 7/2002 | Dietmayer | |
| 6,469,651 B1 * | 10/2002 | Ito | 341/160 |
| 7,012,420 B2 | 3/2006 | Rodi | |
| 7,092,108 B2 * | 8/2006 | Drescher et al. | 356/616 |
| 2003/0107510 A1 | 6/2003 | Gartner et al. | |

FOREIGN PATENT DOCUMENTS

| | | |
|---|---|---|
| DE | 195 02 399 A1 | 10/1995 |
| DE | 698 20 330 T2 | 11/1998 |
| DE | 197 47 753 C1 | 5/1999 |
| DE | 199 20 596 A1 | 11/2000 |
| DE | 199 34 478 A1 | 2/2001 |
| DE | 100 19 500 A1 | 10/2001 |
| DE | 101 60 835 A1 | 6/2003 |
| EP | 0 489 936 A1 | 6/1992 |
| EP | 1 308 696 A2 | 5/2003 |
| EP | 1 437 574 A1 | 7/2004 |

OTHER PUBLICATIONS

Altera Corporation; "Techniques for Implementing Multipliers in Stratix, Stratix GX Cyclone Devices"; Aug. 2003; pp. 1-40; Version 1.0; Application Note 306; San Jose, CA, US.

Ray Andraka; "A Survey of CORDIC Algorithms for FPGA Based Computers"; 1998; pp. 1-10; Monterey, CA, US.

Roland Kircherger and Bernhard Hiller; Oversampling Methods for Improving the Recording of Position and Rotational Speed in Electric Drives with Incremental Sensor Systems.

* cited by examiner

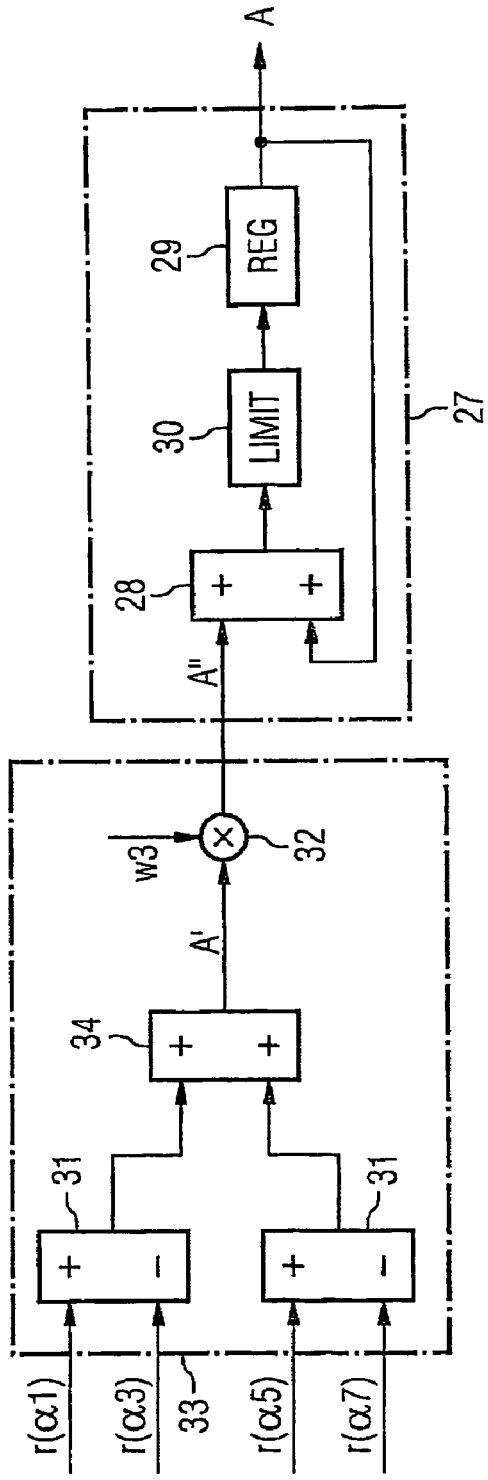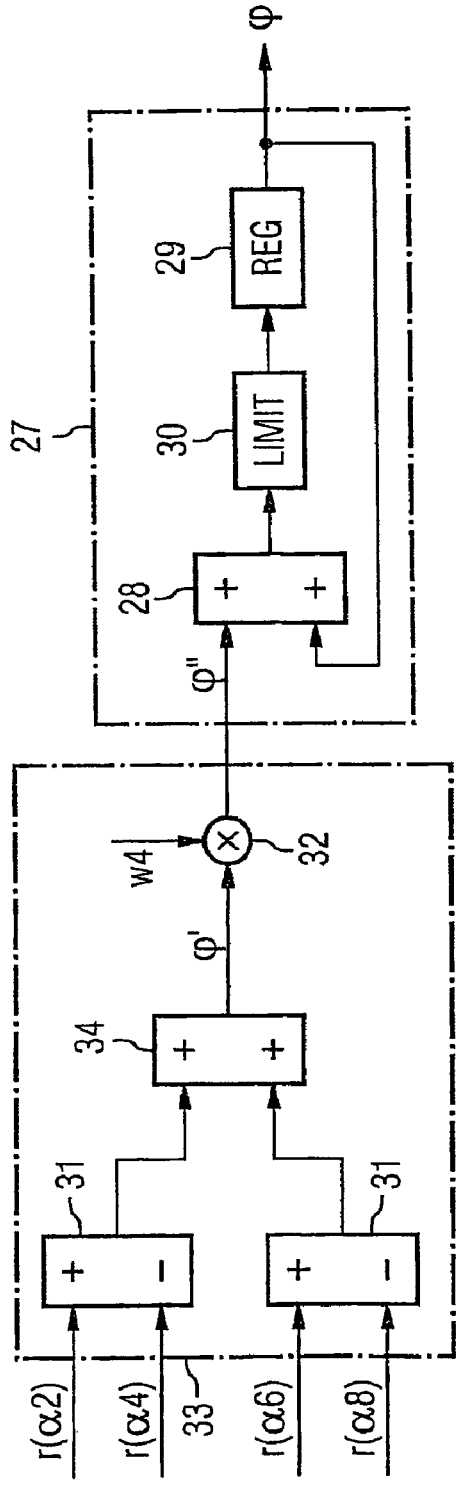

METHOD FOR THE EVALUATION OF A FIRST ANALOG SIGNAL AND A SECOND ANALOG SIGNAL, AND EVALUATION CIRCUIT CORRESPONDING THEREWITH

CROSS REFERENCE TO RELATED APPLICATIONS

This application is the US National Stage of International Application No. PCT/EP2005/053242, filed Jul. 7, 2005 and claims the benefit thereof. The International Application claims the benefits of German application No. 10 2004 033 990.2 DE filed Jul. 7, 2004, both of the applications are incorporated by reference herein in their entirety.

FIELD OF INVENTION

The present invention relates to a method for the evaluation of a first analog signal and a second analog signal, the analog signals being substantially sinusoidal and out of phase by about 90° relative to each other when an element moves in a temporally uniform manner relative to a stationary element, said analog signals making it possible to determine an actual position of the moving element relative to the stationary element and said analog signals having a corresponding maximum frequency when the moving element moves at a maximum speed. The present invention also relates to a corresponding evaluation circuit.

BACKGROUND OF INVENTION

Evaluation circuits of this kind are usually referred to as incremental position sensors. In them, the first signal and the second signal are usually referred to as the cosine signal and the sine signal. An approximate position, accurate to one signal cycle, is determined by evaluating the zero crossings of the signals. By also evaluating the values of the cosine and sine signal themselves—within one signal cycle—a precise position can be defined. The precise position emerges at

| | |
|---|---|
| $\alpha = \arctan(y'/x')$ | for $x' > 0$ |
| $\alpha = \pi + \arctan(y'/x')$ | for $x' < 0$ |
| $\alpha = \pi/2 \operatorname{sign} y'$ | for $x' = 0$. |

$x'$ and $y'$ are signals which have been determined from the cosine signal and the x and the sine signal y (or the first signal x and the second signal y) through correction by offset, amplitude and phase errors $O1$, $O2$, $A$, $\phi$. Ignoring other sources of error, the following applies $$x = \cos\alpha - O1$$

$$y = A \sin(\alpha - \phi) - O2$$

The methods and circuits are generally known. The reader is referred, for example, to DE 100 19 500 A1 or EP 0 489 936 B1 of the applicant and to DE 195 02 399 A1.

Such evaluation methods and the corresponding evaluation circuits are used in particular for recording the position of rotary transducers. In them, one sensor unit in each case records the first analog signal or the second analog signal and feeds it to respectively to an AD converter. Each AD converter digitizes the analog signal fed to it with a scanning frequency and feeds a corresponding digital signal to an evaluation block. The evaluation block determines with the aid of the digital signals an arcus tangens corresponding to the digital signals as well as correction values for the first and the second signal.

Such an evaluation method is also known from the essay "Oversamplingverfahren zur Verbesserung der Erfassung von Lage and Drehzahl an elektrischen Antrieben mit inkrementellen Gebersystemen" [Oversampling methods for improving the recording of position and rotational speed in electric drives with incremental sensor systems] by Roland Kirchberger and Bernhard Hiller, both ISW Stuttgart. In this method, on which the present invention is based, the evaluation block is configured as a hardware circuit. The arcus tangens is determined in real time via a table filed in a memory. The scanning frequency of the AD converters is at least four times as large as the maximum frequency. In the circuit described in the technical essay, it lies at one megahertz.

The evaluation method of the technical essay and the corresponding evaluation circuit represent a considerable step forward compared with the previously mentioned conventional evaluation methods or evaluation circuits. However, the evaluation circuit needs a large storage requirement as the arcus tangens values are filed in the memory in the form of a look-up table.

SUMMARY OF INVENTION

An object of the present invention consists in developing further the evaluation circuit and the evaluation method of the last-mentioned prior art such that the memory can be dispensed with.

The object is achieved for the evaluation method in that the digital signals within the evaluation block are fed to a computing block which calculates the arcus tangens in real time.

Corresponding to this, the object is achieved for the evaluation circuit in that, internally, the evaluation block has a computing block to which the digital signals are fed and which calculates the arcus tangens in real time.

It is possible to correct the analog values prior to digitization with the correction values. Preferably, however, a correction-value add-on block, configured as a hardware circuit, is arranged between the AD converters and the evaluation block, the evaluation block feeds the correction values to the correction-value add-on block and the correction-value add-on block corrects the digital signals by the correction values and outputs the corrected digital signals to the evaluation block.

The correction values can be determined e.g. in that
the computing block also calculates with the aid of the digital signals fed to it a corresponding vector length,
the computing block feeds the arcus tangens and the vector length to a correction-value determining block configured as a hardware circuit,
the correction-value determining block has a number of registers to each of which an angular range is assigned,
the correction-value determining block selects with the aid of the arcus tangens the particular register in whose angular range the arcus tangens lies,
the correction-value determining block stores the vector length in the selected register and
the correction-value determining block updates the correction values with the aid of the vector lengths stored in the registers.

In principle, it is possible to update the correction values each time a new vector length is stored. Preferably, however, the correction-value determining block sets a flag which is assigned to the selected register each time a vector length is stored, updates the correction values only if all the flags are set and resets all the flags in conjunction with the updating of the correction values. A more stable determination of the correction values is then possible.

Determination of the correction values is particularly simple if the correction-value determining block stores the correction values in internal memories, in order to update the correction values with the aid of the vector lengths stored in the registers, firstly calculates correction-value change values in a change-value determining circuit configured as a hardware circuit and adds the correction-value change values in accumulators to the correction values and stores them as new correction values.

The determination of correction values is even simpler if the correction-value determining block calculates with the aid of the vector lengths stored in the registers firstly basic correction values in summators and differentiators by summation and differentiation, multiplies the basic correction values in multipliers with weighting factors and the correction-value change values correspond to the basic correction values multiplied with the weighting factors.

If the angular ranges of the registers with the aid of which the correction-value determining block updates the correction values, in their entirety cover less than 360°, in particular only 180°, or less, the determination of correction values is even more stable.

The evaluation method according to the invention works better, the larger is the ratio of scanning frequency to maximum frequency. The scanning frequency is therefore preferably not only more than twice as large as the maximum frequency, but e.g. at least four times, eight times or even sixteen times as large as the maximum frequency.

The correction values preferably comprise two offset correction values for the first and the second signal, at least one amplitude correction value and at least one phase correction value. All systematic errors can then be corrected, as a result of which a precise positional resolution can be achieved.

Preferably, a clock signal with a clock frequency is fed to a synchronization circuit, the synchronization circuit readjusts the scanning frequency with the aid of the clock frequency such that the scanning frequency is an integral multiple of the clock frequency, and the synchronization circuit feeds the scanning frequency to the AD converters and the evaluation block. It is not then necessary also to determine within the evaluation block an actual speed value. Rather, it suffices merely to determine and output the actual position of the moving element.

In particular, it is possible for the synchronization circuit to output on the basis of a slope of the clock signal a trigger signal to the evaluation block and for the evaluation block, when the trigger signal is present, to determine and output an actual position of the moving element.

If the evaluation block averages a plurality of positions of the moving element determined with the aid of the arcus tangens and the average value corresponds to the actual position, a more precise determination of the actual position is possible as noise is reduced.

If the evaluation block monitors the arcus tangens for an angular jump and takes an angular jump that occurs into account in determining the actual position, the averaging of a plurality of arcus tangens values can also be performed correctly if an angular jump occurs.

If the analog signals are low-pass filtered before digitization with a limiting frequency which lies between the maximum frequency and the scanning frequency, an even more precise determination of the arcus tangens is possible. Corresponding low-pass filters are therefore preferably connected upstream of the AD converters. In principle, however, the AD converters themselves could also intrinsically exhibit such low-pass characteristics.

The design of the computing block is in principle random. Preferably, however, it is configured as a CORDIC block. Hardware circuits of this type are known e.g. from the technical essay "A survey of CORDIC algorithms for FGPA-based computers" by Ray Andraka or from the "CORDIC Reference Design" by the company ALTERA.

The evaluation method according to the invention can thus without exception be realized with elements which can be configured as a hardware circuit. An extensive memory for a look-up table is no longer needed. It is therefore in particular possible for the evaluation block to be configured as an integrated circuit, in particular as an application-specific integrated circuit.

BRIEF DESCRIPTION OF THE DRAWINGS

Further advantages and details will emerge from the description below of an exemplary embodiment, in conjunction with the drawings, in which in schematic representation:

FIGS. 7 to 10 show possible circuit-engineering implementations of output parts of the correction-value determining block and FIG. 11 shows an assignment of angular ranges to registers.

DETAILED DESCRIPTION OF INVENTION

Figure 1:
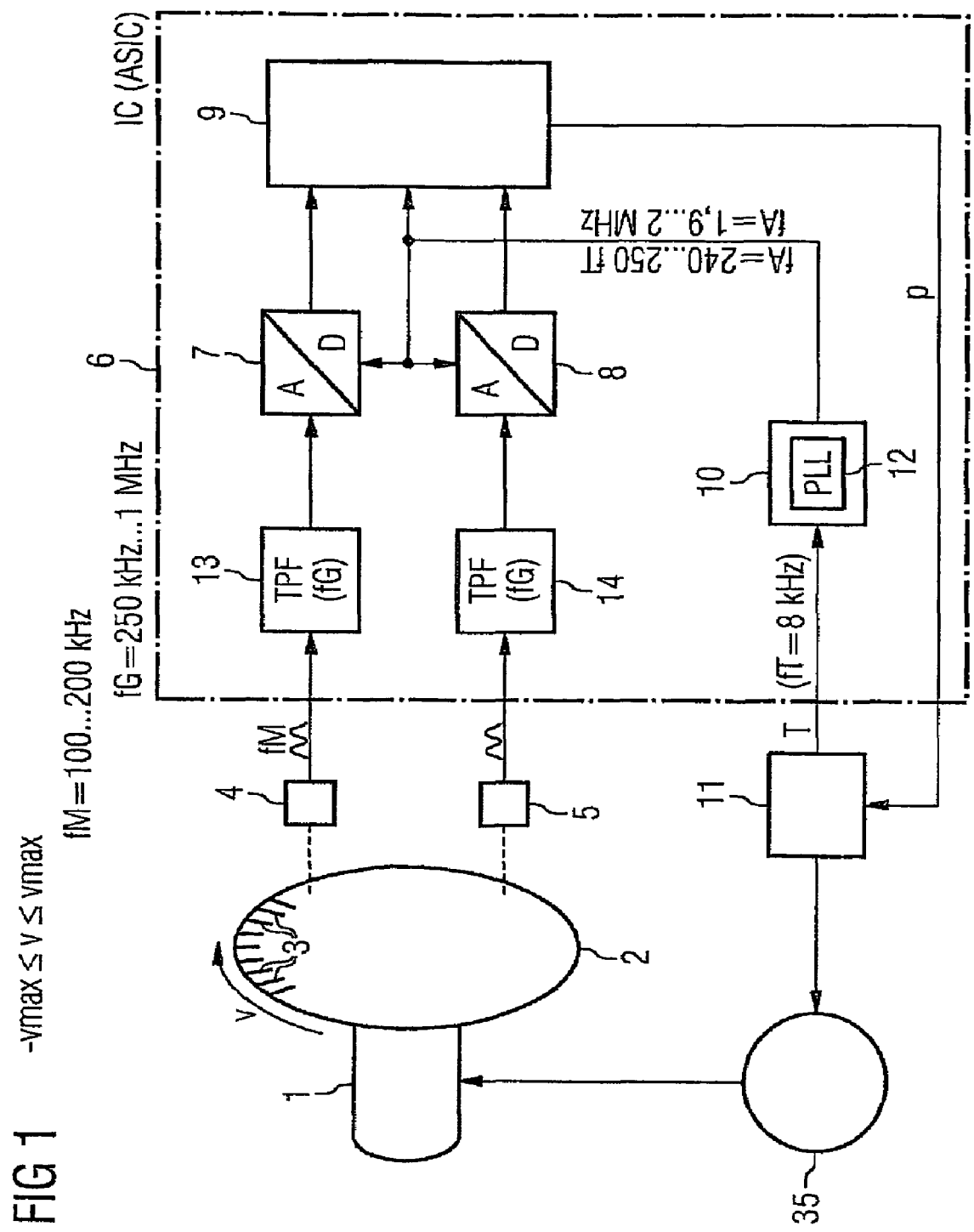
FIG. 1 shows a block diagram of an evaluation circuit according to the invention.

According to FIG. 1, a movement—here a rotary movement—of an element 1 which is moving in relation to a further element, is meant to be recorded. To this end, a sensor disk 2 on which marking elements 3 are applied, is connected to the moving element 1. The marking elements 3 are e.g. optically scanned by two sensor units 4, 5.

The sensor units 4, 5 are components of the stationary element, in relation to which the moving element 1 can be moved. They deliver a first analog signal and a second analog signal. Both signals are essentially sinusoidal and about 90° out-of-phase relative to each other when the sensor disk 2 moves in a temporally uniform manner in relation to the stationary element. A position of the moving element 1 relative to the stationary element can thus be determined with the aid of the sensor signals within a period of the two signals. The methods for determining the position are generally known. In conjunction with a likewise generally known zero-crossing detection, an actual position p of the moving element 1 can thus also easily be determined.

A plurality of marking elements 3, e.g. approx. 1,000 to approx. 2,000 marking lines, are arranged on the sensor disk 2. For each revolution of the sensor disk 2, the first and the second signal thus have a number of periods corresponding to the plurality of marking elements 3.

The moving element 1 has in every operating state a velocity v, the magnitude of which can generally assume any value between zero and a maximum velocity vmax. The maximum velocity vmax can lie e.g. at 6,000 revolutions per minute or 100 revolutions per second. The signals recorded by the sensor units 4, 5 consequently have a maximum frequency fM which—depending on the number of marking elements 3 present—lies between 100 and 200 kHz.

To evaluate the first and the second signal as well as subsequently to determine the actual position p of the sensor disk 2, according to FIG. 1 an evaluation circuit 6 is present. This has two AD converters 7, 8 and an evaluation block 9 as well as a synchronization circuit 10.

A clock signal T which has a clock frequency fT of e.g. about 8 kHz is fed to the synchronization circuit 10 from a master control 11. Internally the synchronization circuit 10 has a frequency regulator 12, e.g. a phase-locked loop 12 (PLL12). It therefore adjusts a scanning frequency fA such that the scanning frequency fA is an integral multiple of the clock frequency fT, e.g. 240 to 250 times the clock frequency fT. The scanning frequency fA therefore lies e.g. at around 1.9 to 2 MHz.

In the event that the sensor disk 2 has 1,000 marking elements 3 and the maximum speed vmax amounts to 100 revolutions per second, the scanning frequency fA is consequently around nineteen to twenty times as large and thus in particular more than sixteen times as large as the maximum frequency fM. However, even if the sensor disk 2 has 2,000 marking elements 3 and the maximum speed vmax amounts to 100 revolutions per second, the scanning frequency fA is still more than eight times as large as the maximum frequency fM.

To flatten the analog signals fed to the AD converters 7, 8, low-pass filters 13, 14 are connected upstream of the AD converters 7, 8. The low-pass filters 13, 14 carry out low-pass filtering of the analog signals. The low-pass filtering is effected with a limiting frequency fG which should lie between the maximum frequency fM and the scanning frequency fA. For example, the limiting frequency fG can lie between 250 kHz and 1 MHz, e.g. at 300 to 600 kHz.

The synchronization circuit 10 feeds the scanning frequency fA to the AD converters 7, 8 and the evaluation block 9. The AD converters 7, 8 and the evaluation block 9 are therefore clocked at the scanning frequency fA. In particular, the AD converters 7, 8 read in at the scanning frequency fA in each case the analog signals fed to them by the sensor units 4, 5 and digitize them. They output the digitized signals to the evaluation block 9.

The evaluation block 9 is—this is explained in even closer detail below—configured as a hardware circuit. It can, in particular, be configured as a user-specific integrated circuit. It determines with the aid of the digital signals a corresponding arcus tangens α and correction values 01, 02, A, φ for the first and the second signal. The determination of the arcus tangens α and the correction values 01, 02, A, φ is carried out by the evaluation block 9 in real time.

Figure 2:
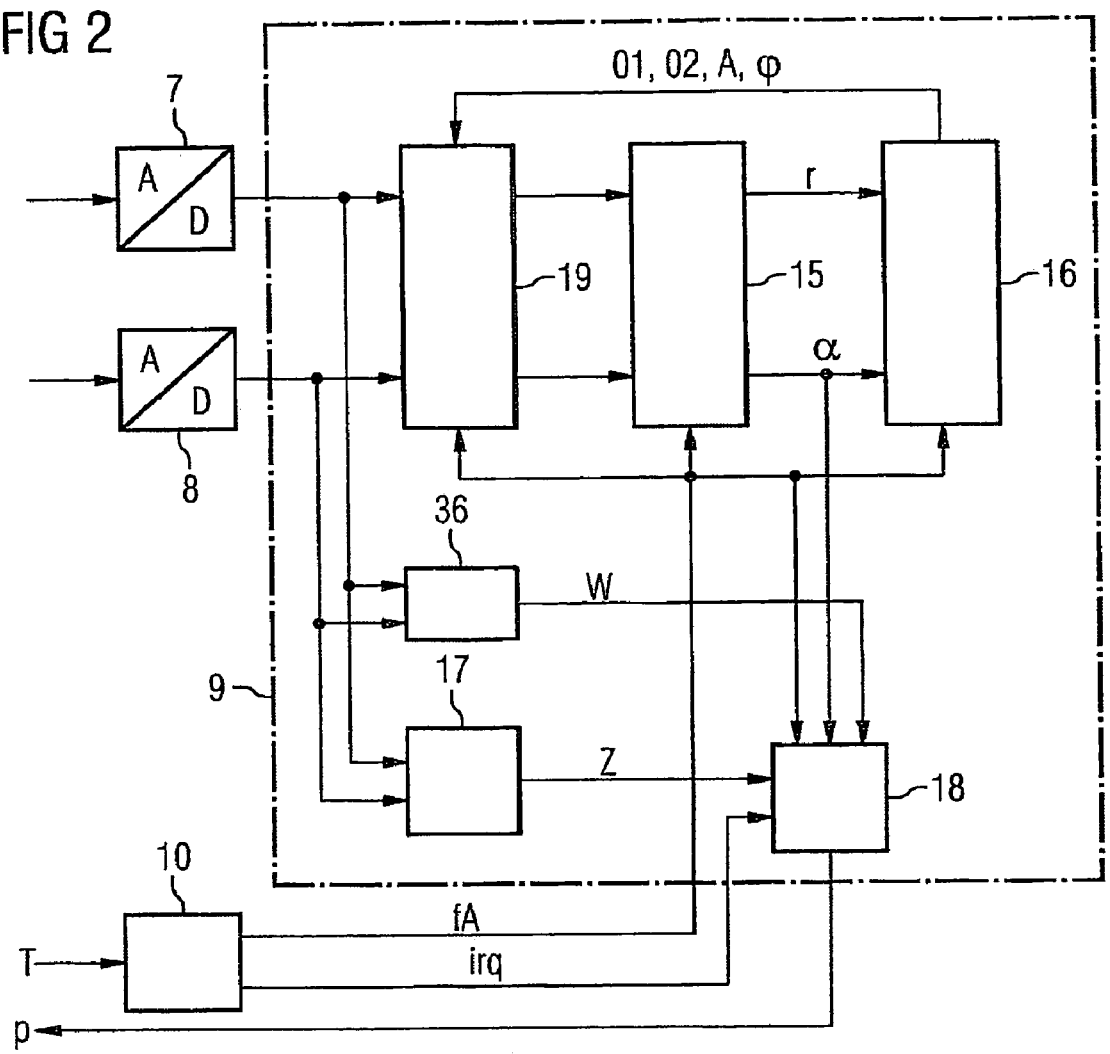
FIG. 2 shows a part of the evaluation circuit from FIG. 1.

Internally the evaluation block 9 has, according to FIG. 2, a computing block 15 and a correction-value determining block 16. It also has a cycle counter 17 and an average-value former 18. The signs of the digital signals are fed to the cycle counter 17. It determines an approximate position of the sensor disk 2.

A correction-value add-on block 19 is connected upstream of the computing block 15. The correction-value add-on block 19 is thus arranged between the AD converters 7, 8 and the computing block 15. It is also configured as a hardware circuit. The correction-value add-on block 19 is fed on the one hand with the digital signals from the AD converters 7, 8 and on the other with the correction values 01, 02, A, φ from the correction-value determining block 16. The correction-value add-on block 19 corrects the digital signals output by the AD converters 7, 8 by the correction values 01, 02, A, φ and outputs the corrected digital signals to the computing block 15. The correction values 01, 02, A, φ comprise one offset correction value 01, 02 respectively for the first and the second signal, an amplitude correction value A for at least one of these two signals, here the second signal, and a phase correction value φ for at least one of the signals, here also the second signal.

Figure 3:
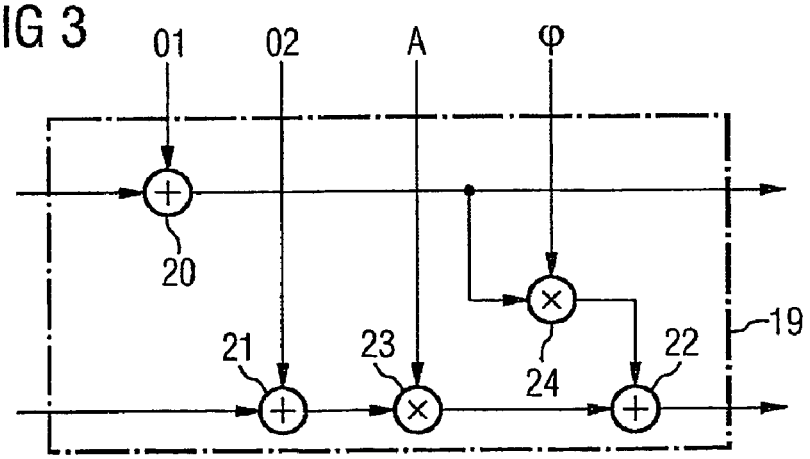
FIG. 3 shows a correction-value add-on block.

According to FIG. 3, the correction-value add-on block 19 has three adders 20 to 22 and two multipliers 23, 24. The still uncorrected digital signals and the offset correction values 01, 02 are fed to the adders 20 and 21. The offset-corrected second digital signal and the amplitude correction value A are fed to the multiplier 23. The offset-corrected first digital signal and the phase correction value φ are fed to the multiplier 24. The output signal of the multiplier 24 and the offset-corrected and amplitude-corrected digitized second signal are fed to the adder 22. The output signals of the adders 20 and 22 correspond to the corrected digital signals. They are fed to the computing block 15.

Figure 4:
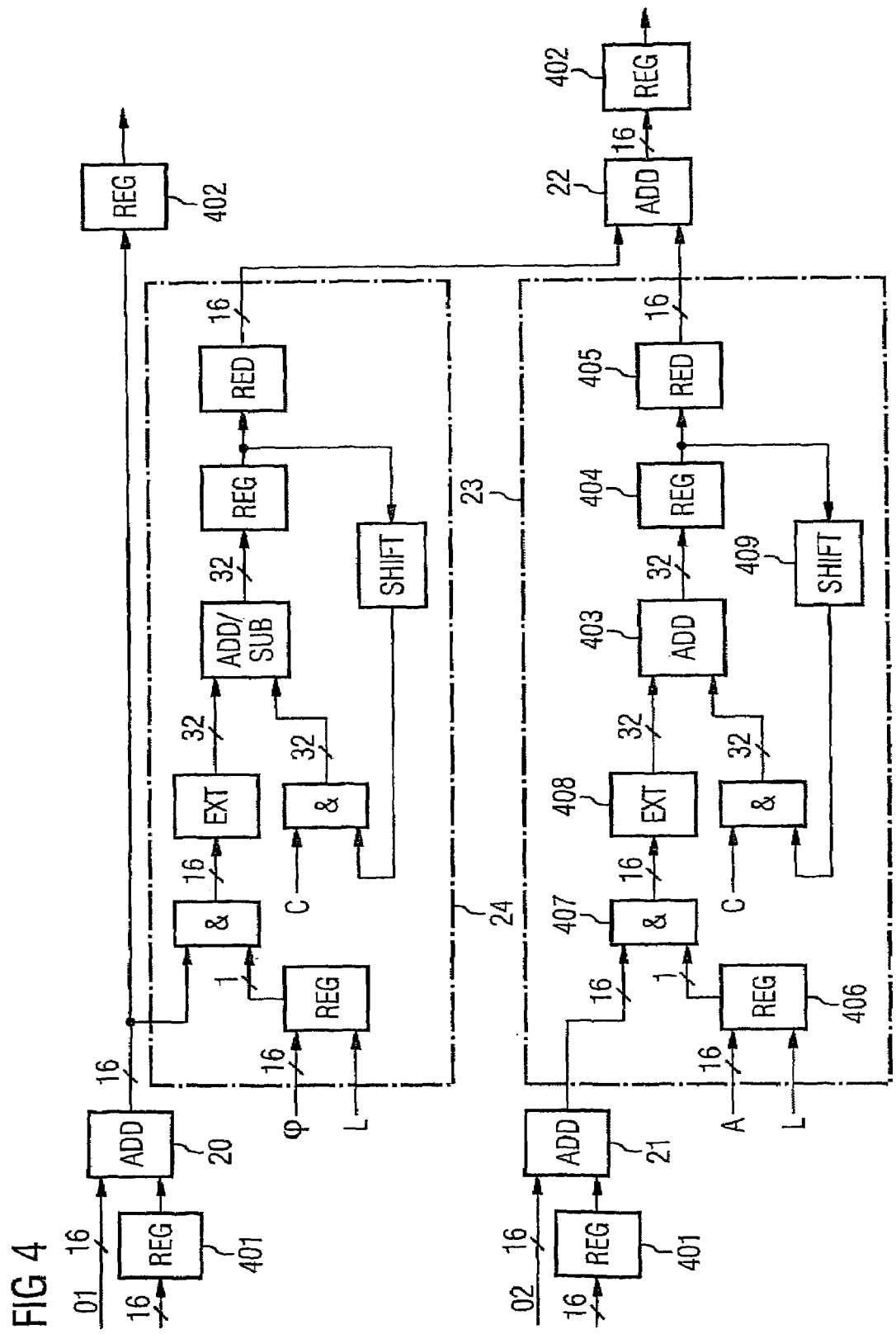
FIG. 4 shows a possible circuit-engineering implementation of the correction-value add-on block from FIG. 3.

As already mentioned, the correction-value add-on block 19 is configured as a hardware circuit. FIG. 4 now shows a possible circuit-engineering implementation of the correction-value add-on block 19.

According to FIG. 4, the adders 20, 21 and 22, for example, are configured as 16-bit adders. Registers 401 are connected upstream of the adders 20 and 21 and registers 402 are connected downstream of the adders 20 and 22. The uncorrected digital signals are fed to the registers 401 and the corrected digital signals to the registers 402. The offset correction values 01 and 02 are fed directly to the adders 20 and 21.

Internally the multiplier 23 has a 32-bit adder 403, downstream of which a register 404 is connected. A bit-width reducer 405 is connected downstream of the register 404. The bit-width reducer 405 reduces the bit width of the output signal of the register 404 from 32 to 16 bits, namely to the highest-value 16 bits.

The amplitude-correction value A is loaded in a shift register when a load signal L is present. However, if the load signal L is not present, the content of the shift register 406 is read out by-by-bit with each cycle of the scanning frequency fA. The bit read out respectively is fed to an AND-gate array 407 which is likewise 16 bits wide. The output signal of the adder 21 is also fed to the AND-gate array 407. The output signal of the AND-gate array 407 is fed via a bit-width expander 408 to the adder 403.

The output signal of the register 404 is fed furthermore to a bit shifter 409 which shifts the signal fed to it by one position (=1 bit). The output signal of the bit shifter 409 is returned again via a further AND-gate array 410 to the adder 403, provided no delete signal C is present at the further AND-gate array 410.

The multiplier 24 has a similar structure to the multiplier 23. Only the input values fed to it and consequently also the output signal output by it are different from those of the multiplier 23. For the offset-corrected second digital signal and the amplitude-correction value A are fed to the multiplier 23, while the offset-corrected first digital signal and the phase-correction value φ are fed to the multiplier 24. Furthermore, the phase-correction value φ can also be negative, which is why the adder of the multiplier 24 must be switchable to subtraction. In other respects, however, the comments relating to the multiplier 23 are also applicable analogously to the multiplier 24. A detailed explanation of the mode of operation of the multiplier 24 can therefore be dispensed with below.

Figure 5:
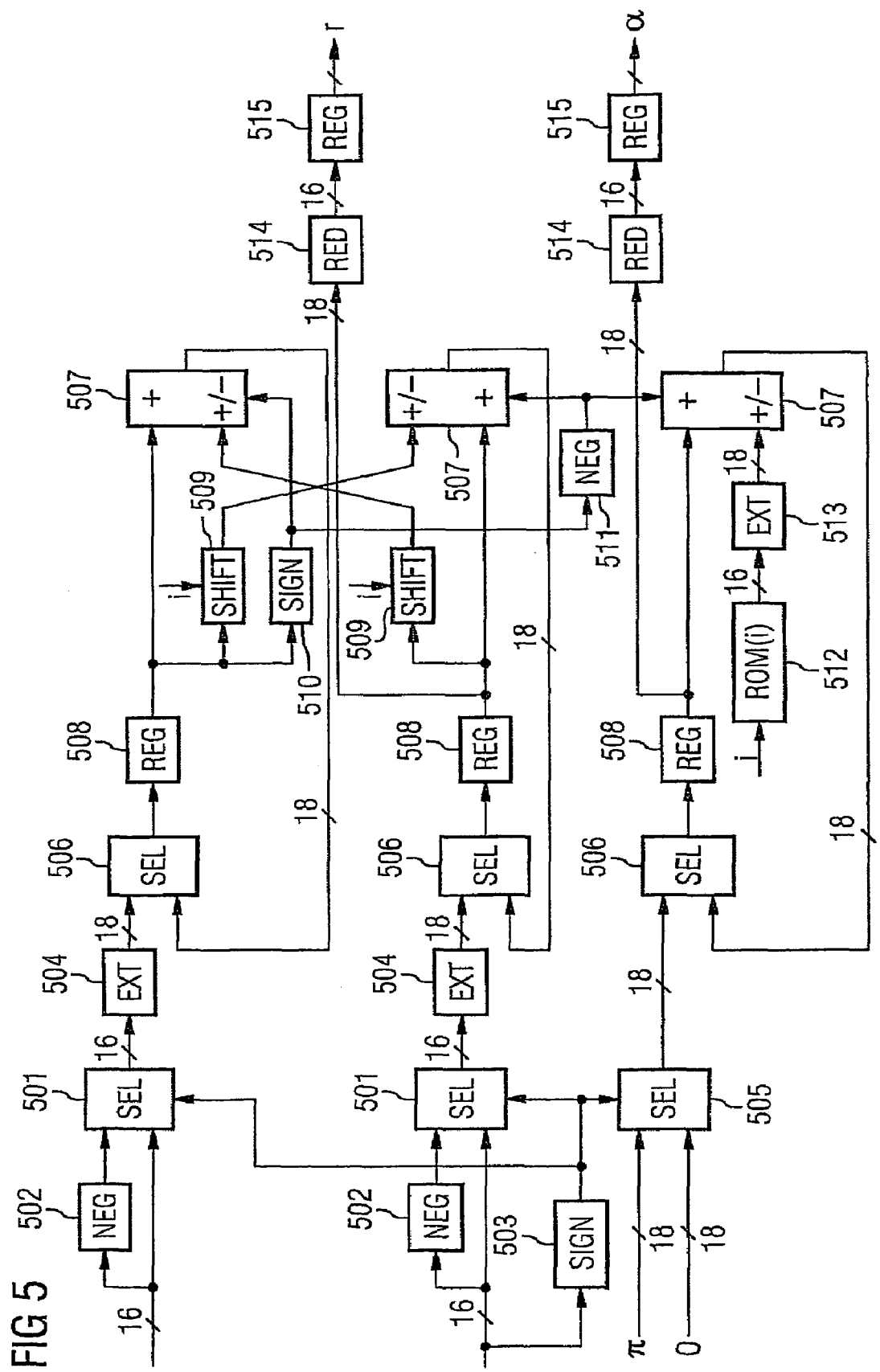
FIG. 5 shows a possible circuit-engineering implementation of a computing block.
Figure 6:
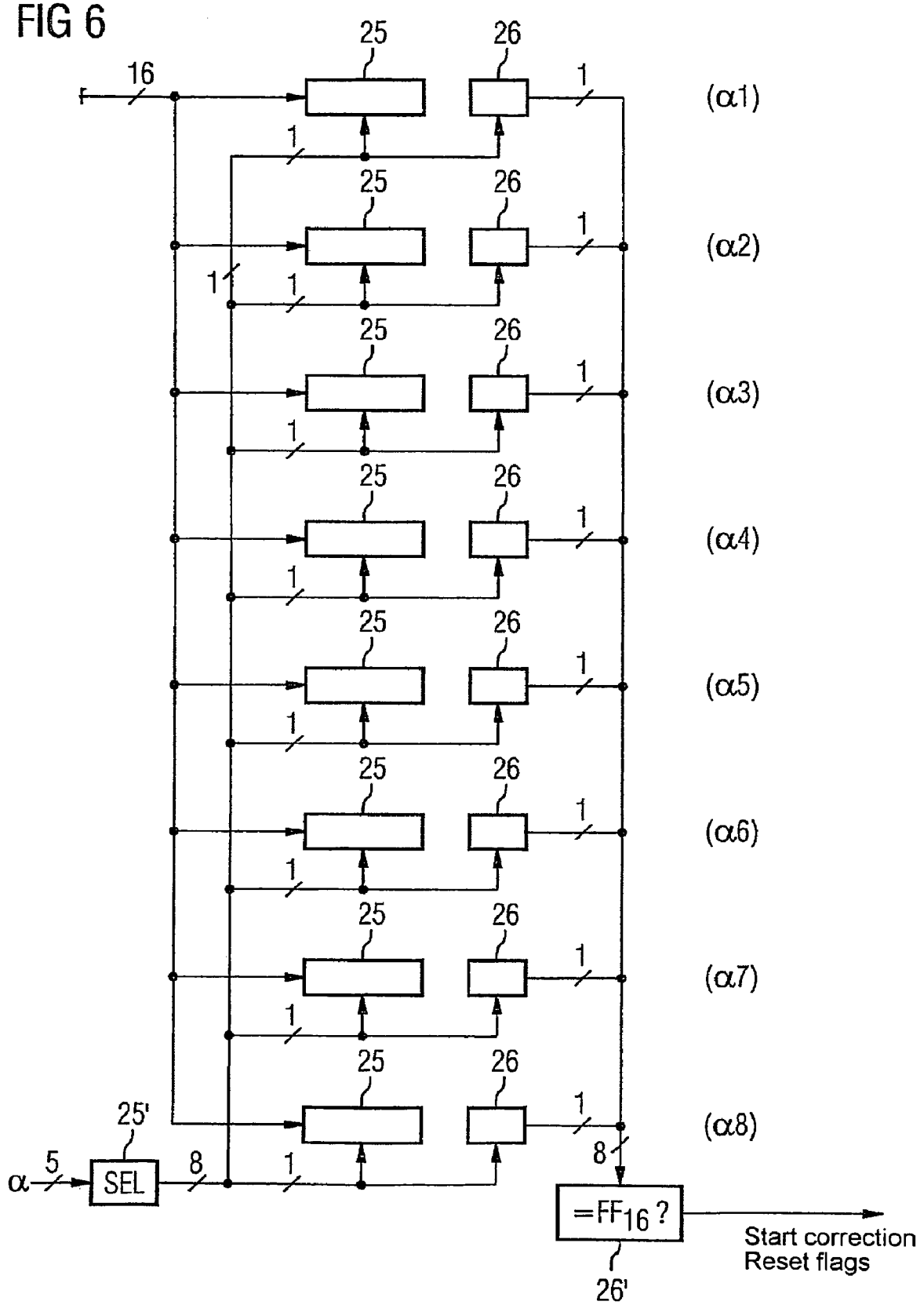
FIG. 6 shows a possible circuit-engineering implementation of an input part of a correction-value determining block

The computing block 15 is also configured as a hardware circuit. It can be configured e.g. as a so-called CORDIC block. FIG. 5 shows a possible circuit-engineering implementation of such a CORDIC block.

According to FIG. 5, the corrected digital signals are fed to selectors 501. Invertors 502 are connected upstream of the selectors 501 so that the negated digital signals are also fed to the selectors 501.

The corrected second signal is fed furthermore to a sign determiner 503, the output signal of which controls the selectors 501 such that these switch through either the corrected digitized first signal and the corrected digitized second signal or else the inverse signals thereto.

Finally bit-width extenders 504 are also connected downstream of the selectors 501, which extenders extend the output signals of the selectors 501 from 16 to e.g. 18 bits.

The output signal of the sign determiner 503 is also fed to a further selector 505 to which the numerical value $\pi$ and 0 are fed as input signals in binary representation. These signals are already 18 bits wide when they are fed to the selector 505.

The output signals of the bit-width extenders 504 and the selector 505 are fed to further selectors 506. The output signals of adders/subtractors 507 are fed to the further selectors 506 as second input signals. A load signal is fed to the further selectors 506 as a control signal, on the basis of which the values from the blocks 504 or 505 are imported at the start of each new computing cycle. Depending on the value of the control signal, some or other of the input signals fed to the further selectors 506 are fed to the registers 508.

As far as the corrected digital signals are concerned, the output signals of the registers 508 are fed firstly directly to each of the adders/subtractors 507 and secondly via bit shifters 509 over a crossing to the other adder/subtractor 507 respectively. In the bit shifters 509, the output signals of the registers 508 are shifted by a number i of positions. The number i runs during a computing cycle through the values 0, 1 etc. to 15.

The output signal of the register 508 which is arranged in the signal path of the first digitized signal is fed furthermore to a sign determiner 510. The output signal of the sign determiner 510 is fed—in part via an inverter 511—as a control signal to the adders/subtractors 507. This control signal thus stipulates whether the adders/subtractors 507 add to one another or subtract from one another the input signals fed to them.

The output signal of the register 508 which is arranged in the remaining signal path is fed directly to the assigned adder/subtractor 507. The contents of the storage cells of a small read-only memory 512 are fed successively to this adder/subtractor 507 as second input signals. The read-only memory 512 has e.g. only 16 storage cells which in turn have a bit width of 16 bits. A bit-width extender 513 is therefore connected downstream of the read-only memory 512, which bit-width extender enlarges the bit width of the signal from 16 to 18 bits. Which of the contents of the read-only memory 512 is read out is determined by the same number i which also determines by how many bits the bit shifters 509 shift the signals fed to them.

The output signals of the registers 508 which are arranged in the signal path of the second digital signal or in the remaining signal path are fed to bit-width reducers 514 which reduce the bit width of the signals fed to them from 18 to 16 bits. These bit-width-reduced signals are stored at the end of a computing cycle in registers 515. The signals read out from these registers 515 are the useful signals of the CORDIC block 15. One of these two signals corresponds to the square root of the sum of the squares of first signal and second signal. It therefore corresponds to a vector length r. The other of these signals corresponds to an angle $\alpha$ which is determined by the first signal and the second signal, that is the arcus tangens $\alpha$.

The computing block 15 consequently calculates—without involving a comprehensive look-up table or the like—with the aid of the digital signals fed to it in real time both the corresponding arcus tangens $\alpha$ and the magnitude r of a corresponding vector, that is the roots from the sum of the squares of first signal and second signal. This magnitude r is drawn hereinbelow as a vector length r.

The computing block 15 feeds according to FIG. 2 each vector length r determined by it and each corresponding arcus tangens $\alpha$ to the correction-value determining block 16. With regard to the arcus tangens $\alpha$, it suffices here if only the highest-value bits of the arcus tangens $\alpha$ are fed to the correction-value determining block 16, e.g. the three, four or five highest bits of the arcus tangens $\alpha$.

Figure 11:
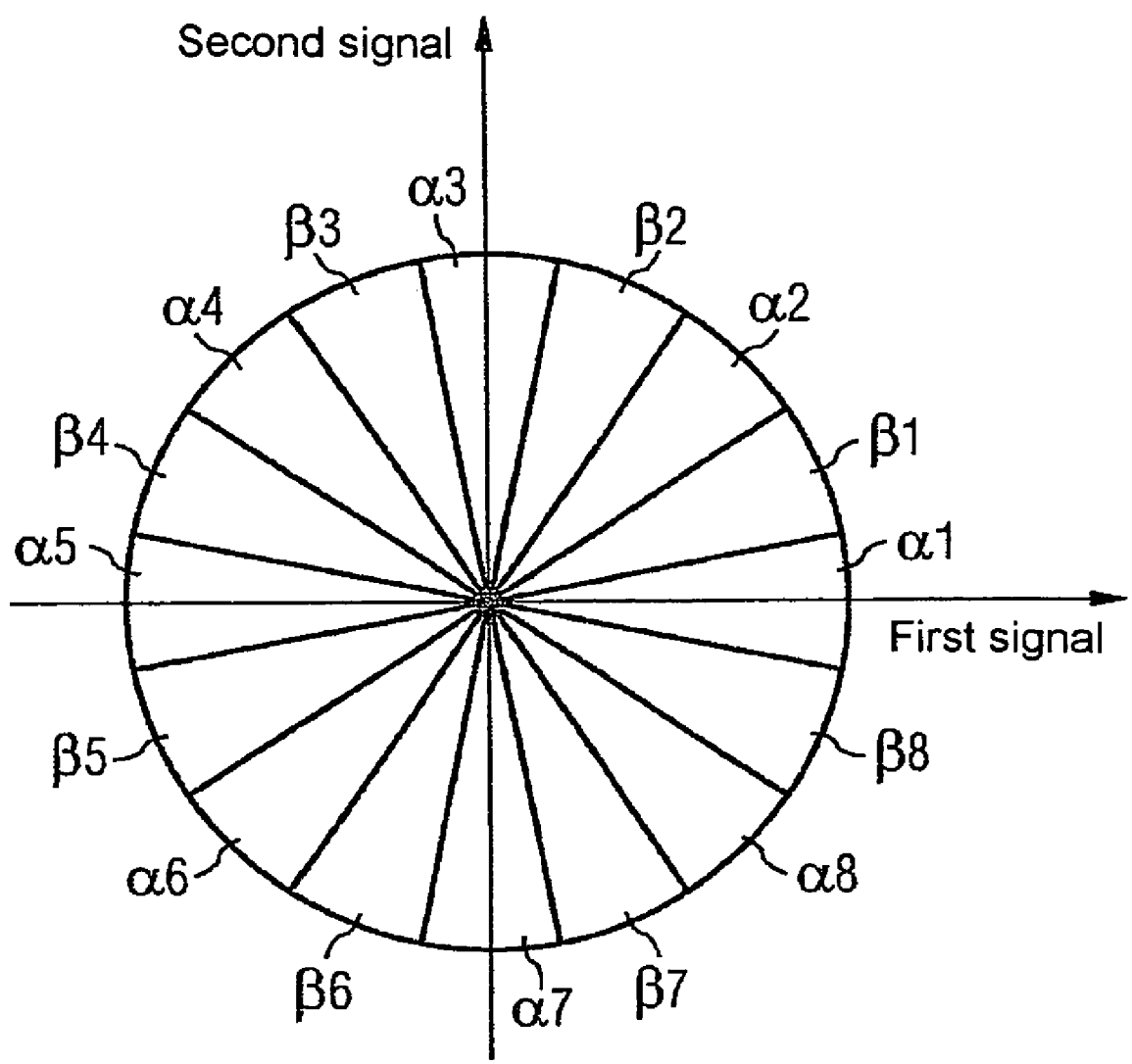

The correction-value determining block 16 is according to FIGS. 6 to 10 also configured as a hardware circuit. It has according to FIG. 6 a number of registers 25, here e.g. eight registers 25. An angular range $\alpha 1 \ldots \alpha 8$ is assigned to each register 25—see also FIG. 11. The angular ranges $\alpha 1 \ldots \alpha 8$ are preferably equal in size to one another. They are preferably separated from one another by angular gaps $\beta 1 \ldots \beta 8$. The angular gaps $\beta 1 \ldots \beta 8$ are preferably also equal in size to one another. They are preferably even just as large as the angular ranges $\alpha 1 \ldots \alpha 8$.

When a vector length r and an arcus tangens $\alpha$ (or its highest-value bits) are fed to the correction-value determining block 16, the correction-value determining block 16 selects by means of a selector 25' with the aid of the arcus tangens $\alpha$ the particular register 25 in whose angular range $\alpha 1 \ldots \alpha 8$ the arcus tangens $\alpha$ lies. In this register 25, the correction value-determining block 16 stores the vector length r. Furthermore, the correction-value determining block 16 sets a flag 26 each time the vector length r is stored in one of the registers 25, which flag is assigned to the respective register 25. This also applies if the flag 26 concerned should have been set prior to storage of the vector length r in the selected register 25.

The correction-value determining block 16 checks by means of a trigger element 26' whether all the flags 26 are set. If all the flags 26 are set (and only then), the correction-value determining block 16 updates with the aid of the vector lengths r stored in the registers 25 the correction values 01, 02, A, φ. In conjunction with the updating of the correction values 01, 02, A, φ, it also resets the flags 26.

Figure 7:
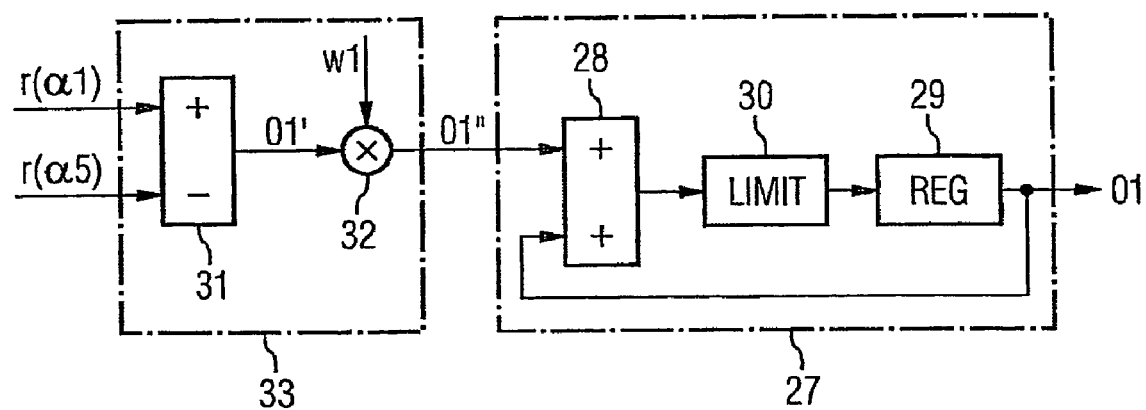

The updating of the correction values 01, 02, A, φ is carried out e.g. with regard to the offset correction value 01 for the first signal in accordance with FIG. 7 as follows:

Internally the correction-value determining block 16 has a memory 27 in which the offset correction value 01 for the first signal is stored. The memory 27 is preferably configured in this case as an accumulator which has a summator 28 and a register 29. A limiter 30 can optionally be arranged between the summator 28 and the register 29.

Two of the vector lengths r filed in the registers 25 are fed to a differentiator 31. The angular ranges $\alpha 1$, $\alpha 5$ assigned to these registers 25 are out of phase by 180° relative to each another. These are angular ranges $\alpha 1$, $\alpha 5$ in which—see FIG. 11 again—ideally the zero crossings of the second signal lie.

The differentiator 31 calculates the difference of the two vector lengths r fed to it, i.e. a basic correction value 01' for the offset correction value 01 of the first signal. This basic correction value 01' is fed to a multiplier 32 which is connected downstream of the differentiator 31. A weighting factor w1 is also fed to the multiplier 32. The weighting factor w1 is as a general rule significantly less than 1. It lies preferably in the range between 0.01 and 0.3, e.g. between 0.03 and 0.15. Alternatively, it can be fixed or parameterizable. Ideally, it lies at ⅛, ¹⁄₁₆ or ¹⁄₃₂.

The multiplier 32 multiplies the basic correction value 01' with the weighting factor w1 fed to it and feeds the product to the summator 28 of the accumulator 27. The product of the basic correction value 01' and the weighting factor w1 corresponds therefore to a correction-value change value 01" for the offset correction value 01 of the first signal.

The differentiator 31 and the multiplier 32 consequently form a change-value determining circuit 33 by means of which the correction-value change value 01" is determined. In the accumulator 27, the respectively determined correction-value change value 01" is added to the previously stored offset correction value 01. The result of the addition is then fed as a new offset correction value 01 to the register 29 and stored there.

Figure 8:
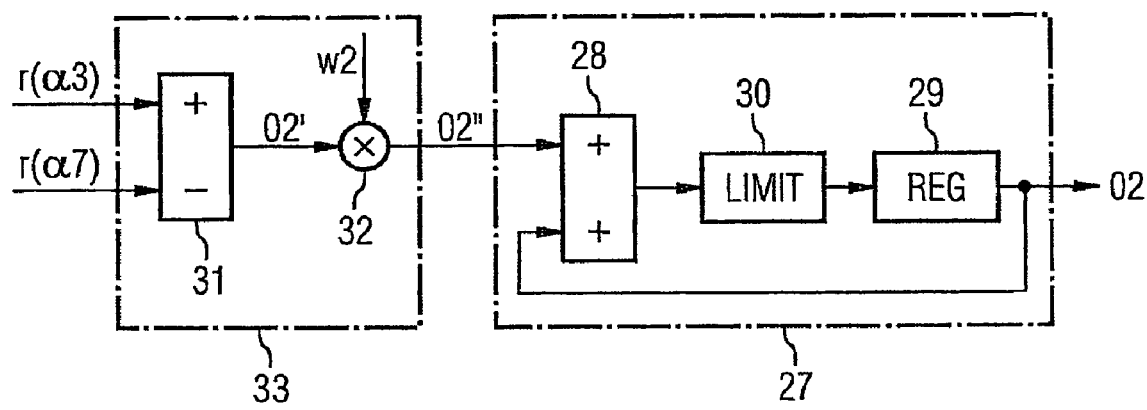

In an analogous manner, the correction-value determining block 16 also determines the offset correction value 02 for the second signal. The corresponding circuit is shown in FIG. 8. It corresponds 1:1 to the circuit shown in FIG. 7. Only the vector lengths r fed to the circuit are taken from other registers 25, namely the particular register 25 to which the angular ranges $\alpha 3$, $\alpha 7$ are assigned. In these angular ranges $\alpha 3$, $\alpha 7$ the first signal should ideally—see FIG. 11—have its zero crossings.

In a similar manner, the correction-value change values A" and $\phi$" are—see FIGS. 9 and 10—also determined for the amplitude correction value A and the phase correction value $\phi$ of the second signal. FIGS. 9 and 10 here are self-explanatory, so no detailed explanations regarding FIGS. 9 and 10 are given below. It should just be mentioned in addition that the circuits for determining the correction-value change values A", $\phi$" have not only differentiators 31 and multipliers 32 but also summators 34.

As already mentioned, the angular ranges $\alpha 1 \ldots \alpha 8$ of the registers 25 are separated from one another by angular gaps $\beta 1 \ldots \beta 8$. The angular ranges $\alpha 1 \ldots \alpha 8$ consequently also only cover less than 360° in total. If the angular gaps $\beta 1 \ldots \beta 8$ are equal in size to the angular ranges $\alpha 1 \ldots \alpha 8$, they even cover only 180°. Even smaller angles of coverage (e.g. only 90° or 120°) are possible.

As already mentioned, the higher-level control 11 of the evaluation circuit 6 according to the invention feeds the clock signal T, the clock signal T having the clock frequency fT and the clock frequency fT typically lying in the low kilohertz range. The higher-level control 11 also controls with the same clock frequency fT, as shown in FIG. 1, a drive 35, by means of which the movement of the moving element 1 can be influenced. To determine a proper actuating signal for the drive 35, the higher-level control 11 needs for each cycle of the clock signal T inter alia the actual position p of the moving element 1.

The synchronization circuit 10 therefore outputs according to FIG. 2 on the basis of each rising slope of the clock signal T (or alternatively on the basis of each falling slope of the clock signal T) a trigger signal irq to the evaluation block 9. The evaluation block 9 then determines, if the trigger signal irq is present, the actual position p of the moving element 1 and outputs this actual position p to the higher-level control 11.

Inside the evaluation block 9, the trigger signal irq is fed to the average-value former 18. The average-value former 18 is in this case also configured as a hardware circuit. The arcus tangens values $\alpha$ calculated by the computing block 15 fed to it. The average-value former 18 then determines the average value of a plurality of arcus tangens values $\alpha$ and outputs this average value together with the counter value Z of the cycle counter 17 as an actual position p. The counter value Z is determined in a manner known in the art in the cycle counter 17.

The averaging to be performed in the average-value former 18 is arranged particularly simply if the number of arcus tangens values $\alpha$ for which an average is being calculated has a power of two. The arcus tangens values $\alpha$ have then only to be added.

The "dividing" by the number of arcus tangens values $\alpha$ can in this case be achieved simply by shifting by a corresponding number of places (e.g. where there are eight arcus tangens values $\alpha$ by three places) or even more simply by a corresponding "shifted" output of the sum value.

The signs of the digital signals are also fed, in accordance with FIG. 2, to a monitoring element 36. The monitoring element 36 is likewise a component of the evaluation block 9 and configured as a hardware circuit. It monitors with the aid of the signs of the digital signals the arcus tangens $\alpha$ for any angular jump. If the monitoring element 36 detects an angular jump, it outputs a corresponding warning signal W to the average-value former 18. The average-value former 18 can therefore take any angular jump that occurs into account when determining the actual position p.

To this end, the average-value former 18 is configured such that it operates internally with at least one bit more than is actually necessary for averaging. This additional bit is then used to double or to enlarge—where there is more than one additional bit—the permissible value range of the average-value former 18. It is therefore possible when a warning signal is present to add a counter value corresponding to $2\pi$ to the arcus tangens value $\alpha$ which has been supplied. It is also possible to subtract this counter value from the arcus tangens value $\alpha$ which has been supplied. The question of whether the counter value is added or subtracted is decided with the aid of the warning signal W from which it must consequently be discernible whether and optionally in what direction the angular jump has occurred.

By means of the inventive approach, it is consequently no longer necessary to provide an extensive memory in which the arcus tangens values $\alpha$—and possibly also the basic correction values 01', 02', A', $\phi$'—are filed in tabular form. It is therefore readily possible to integrate the evaluation block 9 and its components into an integrated circuit or to configure these as such.

The invention claimed is:

1. A method for an evaluation of a first analog signal and a second analog signal, comprising:
   providing the analog signals substantially sinusoidal and out of phase by about 90° relative to each other when an element moves in a temporally uniform manner relative to a stationary element;
   recording the first analog signal by first sensor unit;
   recording the second analog signal by second sensor unit;
   sending the first analog signal and the second analog signal unit to an AD converter;
   digitalizing the analog signals by the AD converters at a scanning frequency, wherein the scanning frequency of the AD converters is more than twice as large as a maximum frequency;
   sending a corresponding digital signal to an evaluation block that is configured as a hardware circuit;
   determining an arc tangent corresponding to the digital signals in real time by the evaluation block;

determining correction values for the first and second signal corresponding to the digital signals in real time by the evaluation block;

sending the digital signals to a computing block within the evaluation block; and calculating the arc tangent in real time, wherein a correction-value add-on block that is configured as a hardware circuit is arranged between the AD converters and the evaluation block, the evaluation block feeds the correction values to the correction-value add-on block and the correction-value add-on block corrects the digital signals by the correction values and outputs the corrected digital signals to the evaluation block.

2. The evaluation method as claimed in claim 1, wherein the computing block calculates from the digital signals fed to it a corresponding vector length, the computing block feeds the arc tangent and the vector length to a correction-value determining block that is configured as a hardware circuit, the correction-value determining block has a number of registers to which an angular range is respectively assigned, the correction-value determining block selects based upon the arc tangent the particular register in whose angular range the arc tangent lies, the correction-value determining block stores the vector length in the selected register, and the correction-value determining block updates the correction values based upon the vector lengths stored in the registers.

3. The evaluation method as claimed in claim 2, wherein the correction-value determining block sets a flag assigned to the selected register each time a vector length is stored, the correction-value determining block updates the correction values only when all the flags are set, and the correction-value determining block, in connection with the updating of the correction values, resets all the flags.

4. The evaluation method as claimed in claim 2, wherein the correction-value determining block stores the correction values in internal memories, to update the correction values, the correction-value determining block first calculates based upon the vector lengths stored in the registers correction-value change values in a change-value determining circuit and the correction-value determining block adds the correction-value change values in accumulators to the correction values and stores them as new correction values.

5. The evaluation method as claimed in claim 4, wherein the correction-value determining block first calculates in summators and differentiators by summation and differentiation basic correction values based upon the vector lengths stored in the registers, the correction-value determining block multiplies the basic correction values in multipliers with weighting factors and the correction-value change values correspond to the basic correction values multiplied with the weighting factors.

6. The evaluation method as claimed in claim 2, wherein the angular ranges of the registers cover in their entirety less than 360°, wherein the correction-value determining block updates the correction values based upon the angular ranges of the registers.

7. The evaluation method as claimed in claim 1, wherein the scanning frequency is at least four times as large as the maximum frequency or least sixteen times as large as the maximum frequency.

8. The evaluation method as claimed in claim 1, wherein the correction values for the first and the second signal comprise two offset correction values, at least one amplitude correction value and at least one phase correction value.

9. The evaluation method as claimed in claim 1, wherein a clock signal with a clock frequency is fed to a synchronization circuit, the synchronization circuit readjusts the scanning frequency based upon the clock frequency such that the scanning frequency is an integral multiple of the clock frequency, and the synchronization circuit feeds the scanning frequency to the AD converters and the evaluation block.

10. The evaluation method as claimed in claim 9, wherein the synchronization circuit outputs on the basis of a slope of the clock signal a trigger signal to the evaluation block and in that the evaluation block determines and outputs the actual position of the moving element when the trigger signal is applied.

11. The evaluation method as claimed in claim 10, wherein the evaluation block averages a plurality of positions of the moving element determined based upon the arc tangent and in that the average value corresponds to the actual position.

12. The evaluation method as claimed in claim 11, wherein the evaluation block monitors the arc tangent for an angular jump and determining the actual position based upon the angular jump.

13. The evaluation method as claimed in claim 1, wherein the analog signals are low-pass filtered before digitizing with a limiting frequency and in that the limiting frequency lies between the maximum frequency and the scanning frequency.

14. An evaluation circuit for a first analog signal and a second analog signal, comprising:

analog signals substantially sinusoidal and out of phase by about 90° relative to each other when an element moves in a temporally uniform manner relative to a stationary element, the first analog signal or the second analog signal are send to at least two AD converters;

the AD converters digitize the analog signals that are send to them at a scanning frequency, wherein the scanning frequency of the AD converters is more than twice as large as a maximum frequency, to output digital signals of the AD converters correspond to the received analog signals;

an evaluation block configured as a hardware circuit, calculates the arc tangent in real time and includes a computing block to which the digital signals are send;

a connection between the AD converters and the evaluation block to send the digital signals from the output of the AD converters to the evaluation block, wherein the evaluation block is configured such that it determines from the digital signals fed to it in real time an arc tangent corresponding to the digital signals and correction values for the first and the second signal; and a correction-value add-on block that is configured as a hardware circuit is arranged between the AD converters and the evaluation block; wherein the correction values are send to the correction-value add-on block by the evaluation block and the digital signals by the AD converters, and wherein the correction-value add-on block corrects the digital signals by the correction values and the correction-value add-on block outputs the corrected digital signals to the evaluation block.

15. The evaluation method as claimed in claim 14, wherein a clock signal with a clock frequency is fed to a synchronization circuit, the synchronization circuit readjusts the scanning frequency based upon the clock frequency such that the scanning frequency is an integral multiple of the clock frequency, and the synchronization circuit feeds the scanning frequency to the AD converters and the evaluation block.

16. The evaluation circuit as claimed in claims 14, wherein low-pass filters are connected upstream of the AD converters, the low-pass filters having a limiting frequency between the maximum frequency and the scanning frequency.

17. The evaluation circuit as claimed in claim 14, wherein the computing block is configured as a CORDIC block.

18. The evaluation circuit as claimed in claim 14, wherein the evaluation block is configured as an application-specific integrated circuit.

* * * * *